United States Patent
Xu et al.

(10) Patent No.: US 10,505,136 B2
(45) Date of Patent: Dec. 10, 2019

(54) LIGHT-EMITTING DIODE, METHOD FOR FABRICATING THE SAME, DISPLAY DEVICE

(71) Applicant: BOE TECHNOLOGY GROUP CO., LTD., Beijing (CN)

(72) Inventors: Wei Xu, Beijing (CN); Xiaolong He, Beijing (CN); Shi Shu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/540,101

(22) PCT Filed: Sep. 23, 2016

(86) PCT No.: PCT/CN2016/099801
§ 371 (c)(1),
(2) Date: Jun. 27, 2017

(87) PCT Pub. No.: WO2017/118102
PCT Pub. Date: Jul. 13, 2017

(65) Prior Publication Data
US 2017/0373266 A1   Dec. 28, 2017

(30) Foreign Application Priority Data

Jan. 6, 2016   (CN) .......................... 2016 1 0009415

(51) Int. Cl.
*H01L 33/44* (2010.01)
*H01L 51/50* (2006.01)
(Continued)

(52) U.S. Cl.
CPC ........ *H01L 51/5096* (2013.01); *H01L 51/001* (2013.01); *H01L 51/0003* (2013.01);
(Continued)

(58) Field of Classification Search
None
See application file for complete search history.

(56) References Cited

U.S. PATENT DOCUMENTS

| 8,876,272 B2 * | 11/2014 | Linton ................. C09D 11/326 347/100 |
| 2007/0241676 A1 * | 10/2007 | Park .................... H01L 51/5096 313/506 |

(Continued)

FOREIGN PATENT DOCUMENTS

| CN | 101055923 A | 10/2007 |
| CN | 103904178 A | 7/2014 |

(Continued)

OTHER PUBLICATIONS

Search Report for International Patent Application No. PCT/CN2016/099801 dated Nov. 8, 2016.
(Continued)

*Primary Examiner* — Ali Naraghi
(74) *Attorney, Agent, or Firm* — Calfee, Halter & Griswold LLP

(57) ABSTRACT

A light-emitting diode, a method for fabricating the same, and a display device are disclosed. The light-emitting diode includes a first and second electrode; a first carrier transporting layer, a light emitting layer, and a second carrier transporting layer which are arranged between the first and second electrode in this order The light-emitting diode further includes a second carrier transporting layer which is arranged between the light emitting layer and the second electrode. The second carrier blocking layer blocks a portion of the second carrier from being transported to the light emitting layer. This decreases the injecting efficiency of the second carrier, improves an injecting balance between the second carrier and the first carrier with a low injecting
(Continued)

efficiency, avoids energy consumption in the form of heat, and increases the light output efficiency and lifetime of the light-emitting diode.

12 Claims, 3 Drawing Sheets

(51) Int. Cl.
*H01L 51/52* (2006.01)
*H01L 51/56* (2006.01)
*H01L 51/00* (2006.01)

(52) U.S. Cl.
CPC ........ *H01L 51/0021* (2013.01); *H01L 51/502* (2013.01); *H01L 51/5064* (2013.01); *H01L 51/5072* (2013.01); *H01L 51/5206* (2013.01); *H01L 51/5221* (2013.01); *H01L 51/56* (2013.01); *H01L 2251/533* (2013.01); *H01L 2251/558* (2013.01)

(56) References Cited

U.S. PATENT DOCUMENTS

| | | | | |
|---|---|---|---|---|
| 2011/0278555 | A1* | 11/2011 | Inoue | C07D 209/82 257/40 |
| 2014/0353579 | A1* | 12/2014 | Greco | G01N 33/588 257/13 |
| 2016/0268545 | A1* | 9/2016 | Sugizaki | H01L 51/5225 |

FOREIGN PATENT DOCUMENTS

| | | |
|---|---|---|
| CN | 105576139 A | 5/2015 |
| CN | 104979485 A | 10/2015 |
| KR | 20120047481 A | 5/2012 |

OTHER PUBLICATIONS

First Office Action for Chinese Patent Application No. 201610009415.4 dated Jan. 22, 2017.
Second Office Action for Chinese Patent Application No. 201610009415.4 dated Apr. 21, 2017.
Third Office Action for Chinese Patent Application No. 201610009415.4 dated Jul. 4, 2017.

\* cited by examiner

LIGHT-EMITTING DIODE, METHOD FOR FABRICATING THE SAME, DISPLAY DEVICE

RELATED APPLICATIONS

The present application is the U.S. national phase entry of PCT/CN2016/099801, with an international filing date of Sep. 23, 2016, which claims the benefit of Chinese Patent Application 201610009415.4, filed on Jan. 6, 2016, the entire disclosures of which are incorporated herein by reference.

TECHNICAL FIELD

The present disclosure relates to the field of display technology, and particularly to a light-emitting diode, a method for fabricating the same, and a display device.

BACKGROUND

A quantum dot light-emitting diode (QLED) is a light-emitting diode in which quantum dots (QDs) are directly activated by a current to emit light. The QLED has advantages of a quantum dot material. For example, the light emitted by the QLED has a tunable wavelength and a narrow linewidth (15-30 nm). The QLED has a high efficiency (70%-100%), excellent photo, heat and chemical stability, and is compatible with film forming processes for an OLED (organic light-emitting diode). These advantages make the QLED to be potentially applied to the new generation of flat panel display with high color quality and low power consumption, and thus have drawn increasingly more attention. However, by taking a red QLED as an example, the red QLED has an external quantum efficiency (EQE) up to 20.5%, a maximum brightness >$10^4$ cd/$m^2$, and a lifetime up to 10 Wh (T50@100 cd/$m^2$). This still falls behind the performance of OLEDs in mass production, and does not meet requirements of commercialized products.

Currently, in a conventional organic-inorganic hybrid QLED device, a quantum dot light emitting layer is interposed between an organic hole transporting layer and an inorganic electron transporting layer to form a sandwich structure. The inorganic electron transporting material usually adopts a film comprising ZnO nano-particles which has a high electron mobility ($10^{-3}$ $cm^2V^{-1}S^{-1}$), for facilitating electron injecting and transporting. The organic hole transporting material has a HOMO in a range of −5.0-6.0 eV, and the quantum dot has a valence band in a range of −6.0-7.0 eV, which indicates there is a large hole injecting barrier therebetween. Furthermore, most organic hole transporting materials have a mobility <$10^{-4}$ $cm^2V^{-1}S^{-1}$, which is nor favorable for hole injecting and transporting in the device. This will lead to an unbalance between electron injecting and hole injecting in the device, and energy will be consumed in the form of heat.

SUMMARY

Embodiments of the present disclosure intend to solve one or more of the above technical problems or other technical problems.

In an exemplary embodiment, a light-emitting diode includes a first electrode and a second electrode; a light emitting layer, which is arranged between the first electrode and the second electrode. The light-emitting diode further includes a first carrier transporting layer, which is arranged between the first electrode and the light emitting layer, and is configured to transport a first carrier injected from the first electrode to the light emitting layer. The light-emitting diode further includes a second carrier transporting layer, which is arranged between the light emitting layer and the second electrode, and is configured to transport a second carrier injected from the second electrode to the light emitting layer. The light-emitting diode further includes a second carrier blocking layer, which is arranged between the light emitting layer and the second electrode, and is configured to block a portion of the second carrier from being transported to the light emitting layer.

In certain exemplary embodiments, the second carrier blocking layer is arranged between the light emitting layer and the second electrode, and blocks a portion of the second carrier from being transported to the light emitting layer. By decreasing the injecting efficiency of the second carrier, it is possible to improve an injecting balance between the second carrier and the first carrier which has a relatively low injecting efficiency, avoid energy consumption in the form of heat, and increase the light output efficiency and lifetime of the light-emitting diode.

In an exemplary embodiment, the second carrier blocking layer is arranged between the light emitting layer and the second carrier transporting layer.

In certain exemplary embodiments, the second carrier blocking layer is arranged between the light emitting layer and the second carrier transporting layer, so that a portion of the second carrier is blocked and does not reach the light emitting layer. This improves the injecting balance between the second carrier and the first carrier.

In an exemplary embodiment, the second carrier blocking layer is arranged between the second carrier transporting layer and the second electrode.

In certain exemplary embodiments, the second carrier blocking layer is arranged between the second carrier transporting layer and the second electrode, so that a portion of the second carrier is blocked and does not reach the light emitting layer. This improves the injecting balance between the second carrier and the first carrier. Besides, since the second carrier blocking layer does not directly contact the light emitting layer, the process for forming the second carrier blocking layer would not damage the light emitting layer, and thus would not affect light emitting performance of the light-emitting diode.

In an exemplary embodiment, the second carrier blocking layer has a refractive index smaller than that of the second carrier transporting layer.

In certain exemplary embodiments, characteristics of the interface between the second electrode and the second carrier transporting layer is improved, and light output efficiency is increased.

In an exemplary embodiment, the second carrier blocking layer is formed by vacuum evaporation or electron beam evaporation.

In certain exemplary embodiments, the second carrier blocking layer formed by electron beam evaporation or vacuum evaporation form is continuous and dense. This improves the light output efficiency, as well as the resistance to water and oxygen erosion. Namely, the light-emitting diode has excellent stability and a longer lifetime.

In an exemplary embodiment, the first carrier is hole, and the second carrier is electron. In certain exemplary embodiments, since the hole has an injecting efficiency significantly lower than that of the electron, in case the second carrier (electron) blocking layer is provided to decrease the injecting efficiency of second carrier (electron), the injecting balance between electrons and holes is improved. In other exemplary embodiments, the first carrier is electron and second carrier is hole, i.e., the electron has an injecting efficiency significantly lower than that of hole.

In an exemplary embodiment, the second carrier blocking layer comprises one or more of $MgF_2$, $AlF_3$, and $SiO_2$.

In certain exemplary embodiments, the above insulating material can efficiently block the electron from injecting, so as to improve the injecting balance between electrons and holes in the light-emitting diode. In other embodiments, the second carrier blocking layer comprises any insulating material from which a continuous and dense film can be formed by vacuum evaporation or electron beam evaporation.

In an exemplary embodiment, the first electrode is a transparent electrode.

In certain exemplary embodiments, the first electrode is transparent and acts as a light exit side of the light-emitting diode.

In an exemplary embodiment, the second electrode is a reflective electrode.

In certain exemplary embodiments, the second electrode is reflective and made from a metal, thus forming a single side emitting light-emitting diode. In other exemplary embodiments, both the first electrode and the second electrode are transparent, thus forming a dual side emitting light-emitting diode.

In an exemplary embodiment, the second carrier blocking layer has a thickness of 0.5 nm-50 nm.

In an exemplary embodiment, the second carrier blocking layer has a thickness of 1%-20% of the thickness of the electron transporting layer.

In certain exemplary embodiments, the thickness of the second carrier blocking layer is adjusted to control the efficiency for the second carrier blocking layer to block the second carrier, thus realizing the injecting balance between the first carrier and the second carrier.

In an exemplary embodiment, the light emitting layer comprises quantum dots.

In certain exemplary embodiments, the light-emitting diode is a QLED. Examples of quantum dots comprise Group II-VI semiconductor quantum dots (e.g., nanocrystals) which are doped with two or more transition or rare earth metal ions. For example, the transition or rare earth metal ions are Cu, Mn, Ag, Ce, Tb, or the like, for emitting light in three primary colors R, G, B. In other embodiments, the light emitting layer emits white light, and light in three primary colors R, G, B are realized by color filters.

In an exemplary embodiment, it is provided a display device, which comprises the above described light-emitting diode.

The display device has same or similar embodiments and beneficial effects as the above light-emitting diode, which are not repeated here for simplicity.

In an exemplary embodiment, a method for fabricating a light-emitting diode, includes forming a first electrode; forming a first carrier transporting layer on the first electrode; forming a light emitting layer on the first carrier transporting layer; forming a second carrier transporting layer and a second carrier blocking layer on the light emitting layer; and forming a second electrode on the second carrier transporting layer or the second carrier blocking layer.

In an exemplary embodiment, forming the first electrode includes cleaning a patterned transparent conductive substrate by means of acetone, ethyl alcohol, de-ionized water, and isopropyl alcohol in this order; and irradiating the substrate with plasma or UV light to form the transparent first electrode.

In an exemplary embodiment, forming the second carrier transporting layer and the second carrier blocking layer on the light emitting layer comprises one of the following: forming the second carrier transporting layer on the light emitting layer, and forming the second carrier blocking layer on the second carrier transporting layer; and forming the second carrier blocking layer on the light emitting layer, and forming the second carrier transporting layer on the second carrier blocking layer.

In an exemplary embodiment, the first carrier is hole, and the second carrier is electron.

In an exemplary embodiment, forming the first carrier transporting layer on the first electrode includes forming a first sub-layer of the first carrier transporting layer by spin coating on the first electrode; and forming a second sub-layer of the first carrier transporting layer on the first sub-layer by spin coating.

In an exemplary embodiment, forming the light emitting layer on the first carrier transporting layer includes forming the light emitting layer comprising a quantum dot film on the second sub-layer of the first carrier transporting layer by spin coating.

In an exemplary embodiment, forming the second carrier transporting layer includes forming the second carrier transporting layer comprising a film comprising inorganic nanoparticles by spin coating.

In an exemplary embodiment, forming the second carrier blocking layer comprises one of the following: forming a film of $AlF_3$ by vacuum thermal evaporation, under a vacuum degree $<10^{-6}$ torr and an evaporation rate of 1-5 Å/s; forming a film of $MgF_2$ by vacuum thermal evaporation, under a vacuum degree $<10^{-6}$ torr and an evaporation rate of 1-5 Å/s; and forming a film of $SiO_2$ by electron beam evaporation, under a vacuum degree $<10^{-5}$ torr and a evaporation rate of 1-10 Å/s.

In an exemplary embodiment, forming the second electrode includes forming a metallic second electrode by vacuum evaporation, under a vacuum degree $<10^{-6}$ torr and an evaporation rate of 1-5 Å/s, and annealing the second electrode in a glovebox at 140-150° C. in an atmosphere of nitrogen for 30 min.

DETAILED DESCRIPTION OF EMBODIMENTS

Embodiments of the present disclosure provide a light-emitting diode, a method for fabricating the same, and a display device. Electron injecting in the light-emitting diode is blocked, so as to improve the carrier injecting balance, the light output efficiency, the brightness, as well as the operation efficiency and lifetime of the light-emitting diode.

Figure 1:
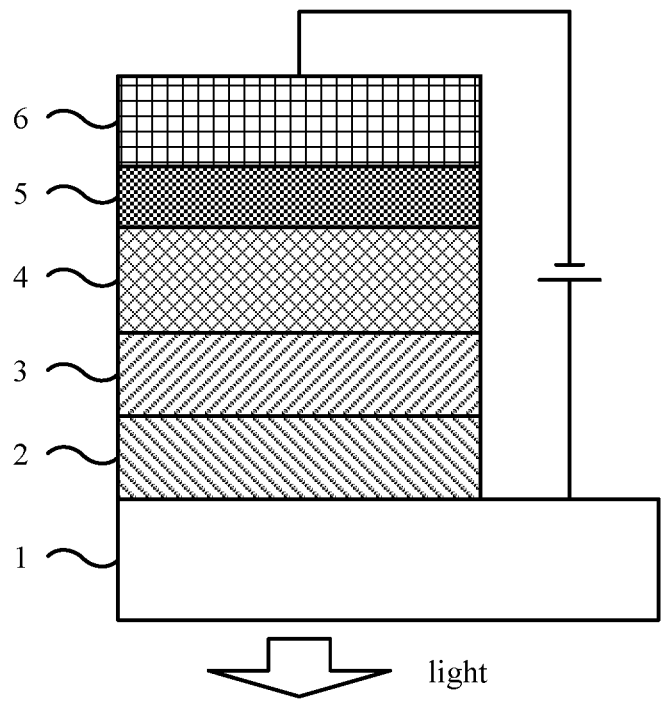
FIG. 1 is a structural diagram for illustrating a light-emitting diode in an embodiment of the present disclosure.

As shown in FIG. 1, in an embodiment of the present disclosure, a light-emitting diode comprises a first electrode 1 and a second electrode 6, a hole transporting layer 2 which is arranged between the first electrode and the second electrode, a quantum dot light emitting layer 3 which is arranged between the hole transporting layer and the second electrode, an electron transporting layer 4 which is arranged between the quantum dot light emitting layer and the second electrode, and an electron blocking layer 5 which is arranged between the electron transporting layer and the second electrode.

For example, the first electrode 1 is an anode, and the second electrode 6 is a cathode. Of course, it is also possible that the first electrode 1 is a cathode and the second electrode 6 is an anode.

For example, the anode is a transparent electrode, and the cathode is a metal electrode. Therefore, an embodiment of the present disclosure provides a QLED with a device configuration shown in FIG. 1. As shown, the QLED comprises for example a transparent anode, a hole transporting layer, a quantum dot light emitting layer, an electron transporting layer, an electron blocking layer, and a metal cathode which are arranged from top to bottom in this order. Since the electron blocking layer is arranged between the electron transporting layer and the metal cathode for blocking the electron from injecting, the balance of carrier injecting is improved, the light output efficiency of the device is improved, the brightness, efficiency and lifetime of the device is increased. Meanwhile, the device's resistance to water and oxygen erosion is improved.

Figure 2:
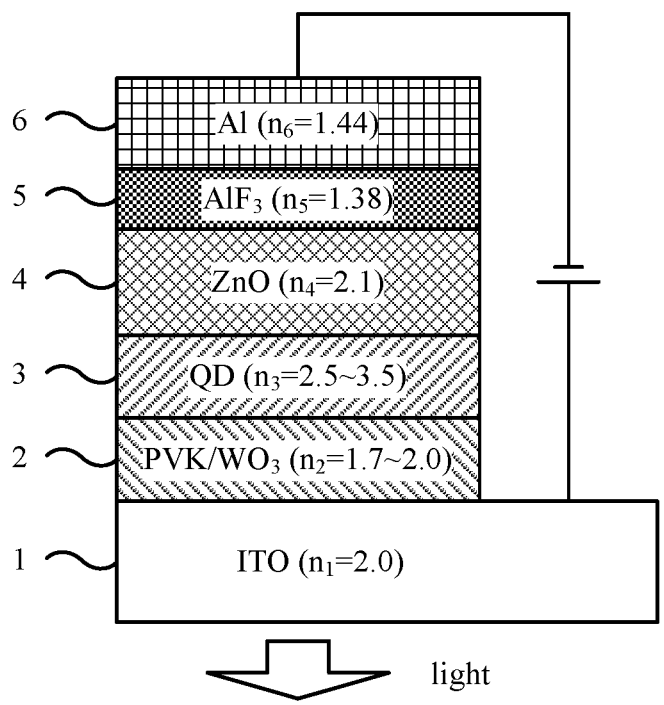
FIG. 2 is a schematic view for illustrating the structure and the refractive indexes for functional layers of a light-emitting diode in an embodiment of the present disclosure.

For example, the electron blocking layer 5 is made from $MgF_2$, $AlF_3$, or $SiO_2$, and has a refractive index smaller than that of the electron transporting layer 4 (which is made from e.g., ZnO), as shown in FIG. 2. For example, the transparent anode 1 is made from ITO or IZO, and has a refractive index $n_1=2.0$. The hole transporting layer 2 has a dual-layer structure, each layer is made from polyvinylcarbazole (PVK) and $WO_3$, and the dual-layer structure has a refractive index $n_2=1.7$-2.0. The quantum dot light emitting layer 3 is made from QDs, and has a refractive index $n_3=2.5$-3.5. The electron transporting layer 4 is made from ZnO, and has a refractive index $n_4=2.1$. The electron blocking layer 5 is made from $AlF_3$, and has a refractive index $n_5=1.38$. The metal cathode 6 is made from Al, and has a refractive index $n_6=1.44$. With such a configuration of refractive indexes, characteristics of the interface between the metal electrode and the electron transporting layer in the QLED are improved, and the light output efficiency of the device is improved.

In addition, the transparent anode is for example made from IZO or the like. The hole transporting layer is for example made from a dual-layer in which both layers are made from organic materials. Examples of such a dual-layer structure comprise PEDOT:PSS and TFB dual-layer, PEDOT:PSS and poly-TPD (Poly[N,N'-bis(4-butylphenyl)-N,N'-bis(phenyl)-benzi) dual-layer, or the like. The quantum dot light emitting layer is made from red (R), green (G), blue (B) QD materials. The electron transporting layer is for example made from $TiO_2$, or $TiO_2$ and ZnO nano-particles. The metal cathode is made from Li and Al.

Examples of the thicknesses for each layer follow. For example, the transparent anode has a thickness of 70 nm-200 nm. The hole transporting layer has a thickness of 50 nm-100 nm. The quantum dot light emitting layer has a thickness of 10 nm-60 nm. The electron transporting layer has a thickness of 40 nm-150 nm. The electron blocking layer has a thickness of 0.5 nm-50 nm. The metal cathode has a thickness of 80 nm-150 nm.

For example, the electron blocking layer has a thickness which is 1%-20% of the thickness of the electron transporting layer. In this manner, the electron blocking layer provides a better effect for electron blocking.

Furthermore, the electron blocking layer is formed by vacuum evaporation or electron beam evaporation. The thus formed electron blocking layer is denser than the electron transporting layer comprising nano-particles, has an improved stability, improves the device's resistance to water and oxygen erosion, and facilitate a device with a longer lifetime.

In the embodiment shown in FIG. 1, the electron blocking layer 5 is arranged between the electron transporting layer 4 and the second electrode 6. However, in other embodiments, the electron blocking layer 5 is arranged between the quantum dot light emitting layer 3 and the electron transporting layer 4. Theoretically, it is possible for the electron blocking layer 5 to arrange at any position between light emitting layer 3 and the second electrode 6.

Figure 3:
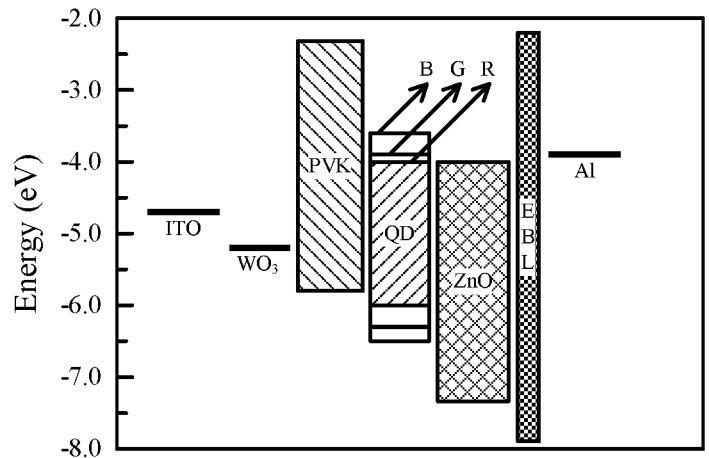
FIG. 3 is a diagram for illustrating energy levels of a light-emitting diode in an embodiment of the present disclosure.

In the QLED according to embodiments of the present disclosure, the semiconductor material in each layer has the following energy levels. According to the energy level theory, electrons can only move in specific and discrete orbitals. The electrons in each orbital have discrete energies, and the values of these energies are energy levels. As shown FIG. 3, for example, the ITO anode has a work function (the minimum energy which is required for an electron to move from the inside of a solid just to the surface) about −4.7 eV, the first hole transporting layer $WO_3$ has a work function about −5.2 eV, and the second hole transporting layer PVK has a HOMO (highest occupied molecular orbital) energy level about −5.8 eV. As for QDs which emit in the visible region of 380 nm-720 nm, red QDs generally have a valence band energy level about −6.0 eV and a conduction band energy level about −4.0 eV; green QDs generally have a valence band energy level about −6.3 eV and a conduction band energy level about −3.9 eV; and blue QDs generally have a valence band energy level about −6.5 eV and a conduction band energy level about −3.6 eV. ZnO has a conduction band energy level about −4.0 eV and a valence band energy level about −7.5 eV. An Al electrode has a work function about −4.1 eV. The hole injecting barrier between $WO_3$ and PVK is about 0.6 eV, and the hole injecting barrier between PVK and QDs is about 0.2-0.7 eV. Namely, holes in the device have to overcome a relatively large barrier of 0.8-1.3 eV to inject. The electron injecting barrier between ZnO and QDs is about 0-0.4 eV, so that ZnO not only efficiently injects electrons but also effectively blocks holes. Therefore, by adding an electron blocking layer EBL between ZnO and the Al electrode in the QLED device, electron injecting is blocked efficiently, and the injecting balance between electrons and holes in the device is improved. For example, the electron blocking layer EBL comprises one of $MgF_2$, $AlF_3$, $SiO_2$ (all of these materials are insulating), or any combination thereof.

A method for fabricating a QLED in an embodiment of the present disclosure will be described hereinafter in detail.

Figure 4:
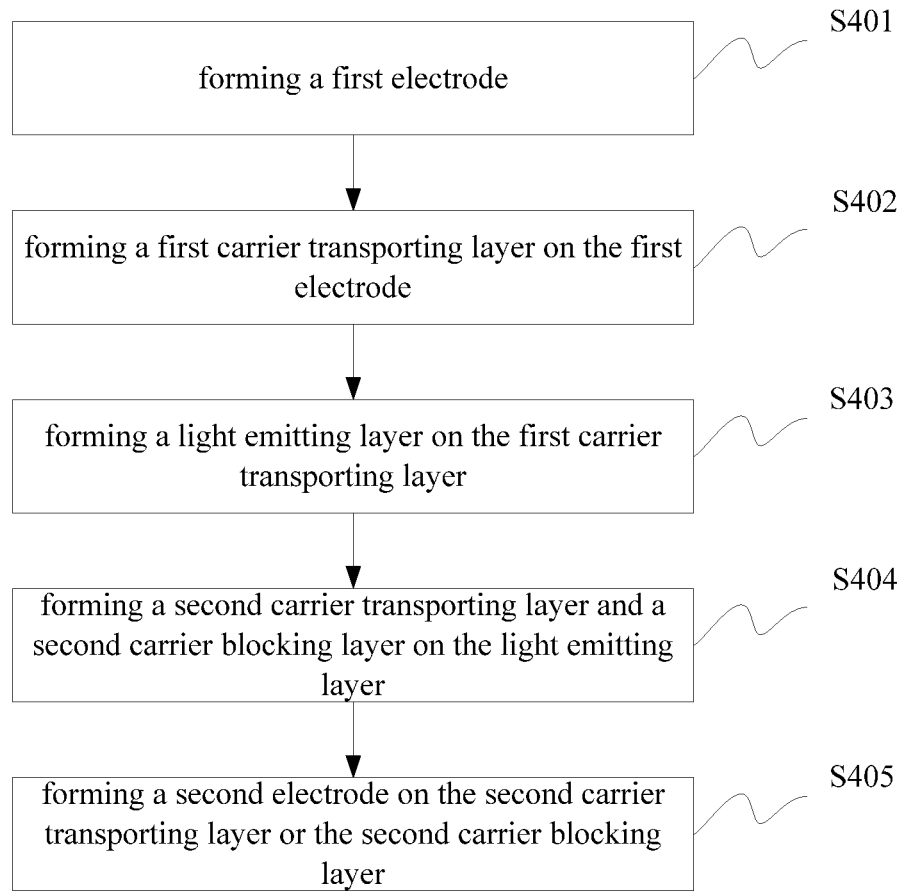
FIG. 4 is a flow chart for illustrating a method for fabricating a light-emitting diode in an embodiment of the present disclosure.

As shown in FIG. 4, in an embodiment of the present disclosure, a method for fabricating a light-emitting diode comprises:

S401, forming a first electrode;

S402, forming a first carrier transporting layer on the first electrode;

S403, forming a light emitting layer on the first carrier transporting layer;

S404, forming a second carrier transporting layer and a second carrier blocking layer on the light emitting layer; and S405, forming a second electrode on the second carrier transporting layer or the second carrier blocking layer.

Figure 5:
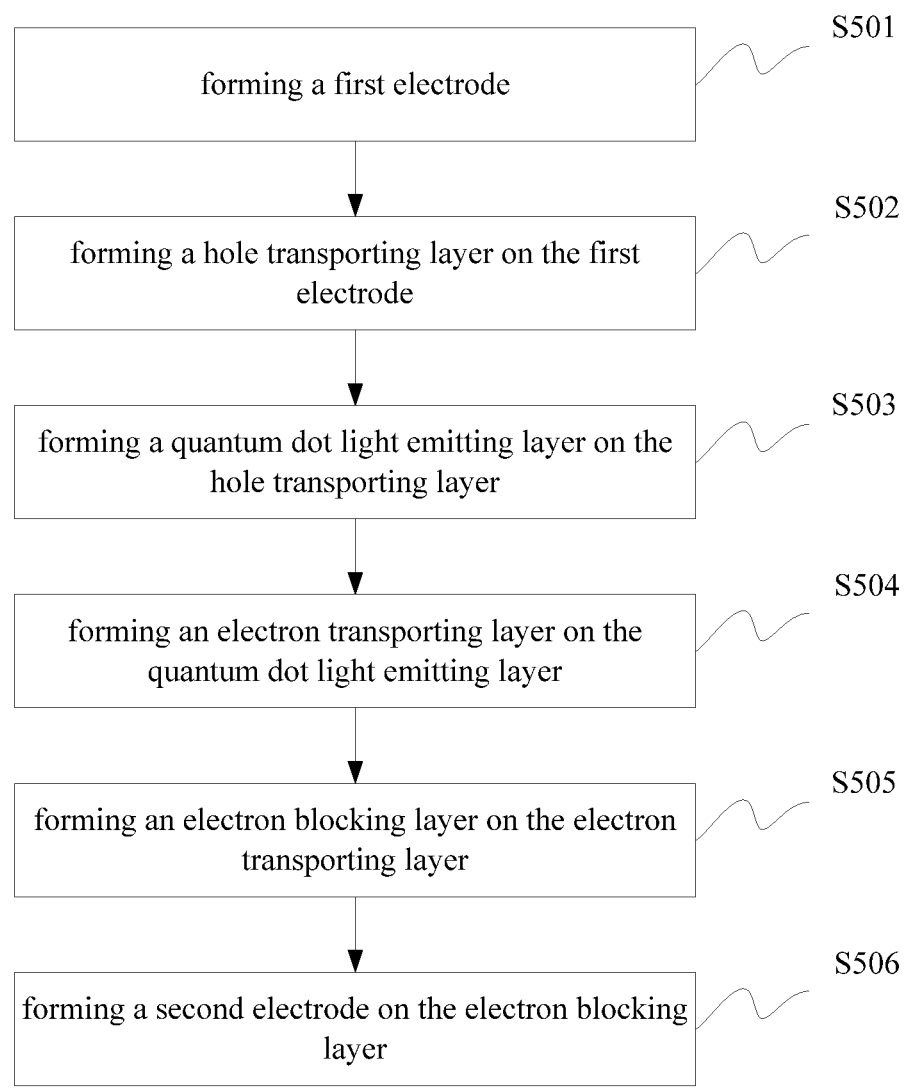
FIG. 5 is a flow chart for illustrating a method for fabricating a QLED in an embodiment of the present disclosure.

The method will be described with reference to FIG. 5, by taking a QLED in which the electron has an injecting efficiency significantly higher than the hole as an example. For example, the method comprises:

S501, forming a first electrode;

S502, forming a hole transporting layer on the first electrode;

S503, forming a quantum dot light emitting layer on the hole transporting layer;

S504, forming an electron transporting layer on the quantum dot light emitting layer;

S505, forming an electron blocking layer on the electron transporting layer; and S506, forming a second electrode on the electron blocking layer.

For example, the step S501 of forming the first electrode comprises: cleaning a patterned transparent conductive substrate by means of acetone, ethyl alcohol, de-ionized water, and isopropyl alcohol in this order; and irradiating the substrate with plasma or UV light to form the transparent first electrode.

For example, the step S502 of forming the hole transporting layer on the first electrode comprises: forming the first hole transporting layer on the transparent first electrode by spin coating; and forming the second hole transporting layer on the first hole transporting layer by spin coating.

For example, the step S503 of forming the quantum dot light emitting layer on the hole transporting layer comprises: forming a quantum dot film on the second hole transporting layer by spin coating, wherein the quantum dot film is a quantum dot light emitting layer.

For example, the step S504 of forming the electron transporting layer on the quantum dot light emitting layer comprises: forming a film comprising inorganic nano-particles on the quantum dot light emitting layer by spin coating, wherein the film comprising inorganic nano-particles is an electron transporting layer.

For example, in an embodiment, the step S505 of forming the electron blocking layer on the electron transporting layer comprises: forming a film of $AlF_3$ on the electron transporting layer by vacuum thermal evaporation, under a vacuum degree $<10^{-6}$ torr and an evaporation rate of 1-5 Å/s (angstrom/sec). In another embodiment, step S505 comprises: forming a film of $MgF_2$ on the electron transporting layer by vacuum thermal evaporation, under a vacuum degree $<10^{-6}$ torr and an evaporation rate of 1-5 Å/s. In another embodiment, step S505 comprises: forming a film of $SiO_2$ on the electron transporting layer by electron beam evaporation, under a vacuum degree $<10^{-5}$ torr and a evaporation rate of 1-10 Å/s.

For example, the step S506 of forming the second electrode on the electron blocking layer comprises: form a metallic second electrode on the electron blocking layer by vacuum evaporation, under a vacuum degree $<10^{-6}$ torr and an evaporation rate of 1-5 Å/s, and annealing the second electrode in a glovebox at 140-150° C. in an atmosphere of nitrogen for 30 min (minutes).

An example of the method for fabricating a QLED will be described hereinafter, in which the first electrode is a transparent anode and the second electrode is a metal cathode.

In a first step, a patterned transparent conductive substrate is cleaned by acetone, ethyl alcohol, de-ionized water, and isopropyl alcohol in this order, and is irradiated by plasma or UV to increase the work function or surface hydrophilicity of the conductive substrate. As a result, a transparent anode is obtained.

In a second step, a first hole transporting layer is formed on the above conductive substrate (i.e., transparent anode) by spin coating. For example, the first hole transporting layer is made from a material selected from the group consisting of $WO_3$, NiO, $MoO_3$, P—ZnO nano-particles, PEDOT:PSS. The spin coating is performed at a rotation rate of 5000 r.p.m. The first hole transporting layer is annealed in a glovebox at 80-150° C. in an atmosphere of nitrogen for 15 min. In case inorganic nano-particles are used, its concentration in ethyl alcohol is 10-50 mg/mL. In case PEDOT:PSS is used, its concentration in water is 6 wt. %. An organic molecule film is formed on the above film comprising inorganic nano-particles by spin coating, to form the second hole transporting layer. The material for the second hole transporting layer can be selected from PVK, poly-TPD, TFB. The spin coating is performed at a rotation rate of 3000 r.p.m., and the second hole transporting layer is annealed in a glovebox at 150° C. in an atmosphere of nitrogen for 30 min. The organic molecule used for forming the second hole transporting layer has a concentration in a chlorobenzene solution of 0.5-5 wt. %.

Namely, in an embodiment of the present disclosure, the hole transporting layer comprises a first hole transporting layer and a second hole transporting layer. During forming the hole transporting layer, the first hole transporting layer is formed, and then the second hole transporting layer is formed.

In a third step, a quantum dot film is formed on the above organic molecule film (i.e., the second hole transporting layer) by spin coating, to form a quantum dot light emitting layer. The quantum dot light emitting layer can be made from CdSe/CdS/ZnS, CdSe/ZnSe/ZnS, ZnCdS/ZnS, ZnSe/ZnS, InP/ZnSe/ZnS, or the like. The spin coating is performed at a rotation rate of 3000 r.p.m. The quantum dot light emitting layer is annealed in a glovebox at 80-110° C. in an atmosphere of nitrogen for 15 min. The quantum dots for forming the quantum dot light emitting layer has a concentration in n-hexane or methylbenzene solution of 10-30 mg/mL.

In a fourth step, a film comprising inorganic nano-particles is formed on the above sol-gel inorganic metal oxide film (i.e., the quantum dot light emitting layer) by spin coating, to form the electron transporting layer. The electron transporting layer has a surface roughness RMS <1 nm. The spin coating is performed at a rotation rate of 2000 r.p.m. The electron transporting layer is annealed in a glovebox at 80-110° C. in an atmosphere of nitrogen for 15 min. The inorganic nano-particles for forming the electron transporting layer have a concentration in ethyl alcohol of 10-50 mg/mL. It is annealed in an atmosphere of nitrogen for 30 min.

In a fifth step, an electron blocking layer is deposited on the electron transporting layer comprising inorganic metal oxide nano-particles by vacuum thermal evaporation or electron beam evaporation. This is realized by one of the following modes.

In a first mode, a film of $AlF_3$ is formed by vacuum thermal evaporation, under a vacuum degree $<10^{-6}$ torr and a evaporation rate of 1-5 Å/s.

In a second mode, a film of MgF$_2$ is formed by vacuum thermal evaporation, under a vacuum degree <10$^{-6}$ torr and an evaporation rate of 1-5 Å/s.

In a third mode, a film of SiO$_2$ is formed by electron beam evaporation, under a vacuum degree <10$^{-5}$ torr and an evaporation rate of 1-10 Å/s.

In the sixth step, a metal film is formed as a cathode by vacuum evaporation, under a vacuum degree <10$^{-6}$ torr and an evaporation rate of 1-5 Å/s. It is annealed in a glovebox at 140-150° C. in an atmosphere of nitrogen 30 min.

Alternatively, in an embodiment of the present disclosure, a method for fabricating a QLED comprises: forming a first electrode; forming an electron blocking layer on the first electrode; forming an electron transporting layer on the electron blocking layer; forming a quantum dot light emitting layer on the electron transporting layer; forming a hole transporting layer on the quantum dot light emitting layer; and forming a second electrode on the hole transporting layer.

For example, forming the first electrode comprises: cleaning a patterned transparent conductive substrate by means of acetone, ethyl alcohol, de-ionized water, and isopropyl alcohol in this order; and irradiating the substrate with plasma or UV light to form the transparent first electrode.

For example, forming the hole transporting layer on the quantum dot light emitting layer comprises: forming a first hole transporting layer on the quantum dot light emitting layer by spin coating; and forming a second hole transporting layer on the first hole transporting layer by spin coating.

For example, forming the quantum dot light emitting layer on the electron transporting layer comprises: forming a quantum dot film on the electron transporting layer by spin coating, wherein the quantum dot film is a quantum dot light emitting layer.

For example, forming the electron transporting layer on the electron blocking layer comprises: forming a film comprising inorganic nano-particles on the electron blocking layer by spin coating, wherein the film comprising inorganic nano-particles is an electron transporting layer.

For example, forming the electron blocking layer on the first electrode comprises: forming a film of AlF$_3$ on the first electrode by vacuum thermal evaporation, under a vacuum degree <10$^{-6}$ torr and an evaporation rate of 1-5 Å/s; or, forming a film of MgF$_2$ on the first electrode by vacuum thermal evaporation, under a vacuum degree <10$^{-6}$ torr and an evaporation rate of 1-5 Å/s; or, forming a film of SiO$_2$ on the first electrode by electron beam evaporation, under a vacuum degree <10$^{-5}$ torr and a evaporation rate of 1-10 Å/s.

For example, forming the second electrode on the hole transporting layer comprises: forming a metallic second electrode on the hole transporting layer by vacuum evaporation, under a vacuum degree <10$^{-6}$ torr and an evaporation rate of 1-5 Å/s, and annealing the second electrode in a glovebox at 140-150° C. in an atmosphere of nitrogen for 30 min.

A display device in an embodiment of the present disclosure comprises the QLED as described in the above embodiments.

For example, in each of the above embodiments, the first electrode and the second electrode have a layer form.

To sum up, embodiments of the present disclosure provide a light-emitting diode, a method for fabricating the same, and a display device. The second carrier blocking layer is arranged between the light emitting layer and the second electrode, and blocks a portion of the second carrier from being transported to the light emitting layer. By decreasing the injecting efficiency of the second carrier, an injecting balance between the second carrier and the first carrier which has a relatively low injecting efficiency is improved. This avoids energy consumption in the form of heat, and increases the light output efficiency and lifetime of the light-emitting diode.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A light-emitting diode, comprising:
   a first electrode and a second electrode;
   a light emitting layer, which is arranged between the first electrode and the second electrode;
   a first carrier transporting layer, which is arranged between the first electrode and the light emitting layer, and is configured to transport a first carrier injected from the first electrode to the light emitting layer;
   a second carrier transporting layer, which is arranged between the light emitting layer and the second electrode, and is configured to transport a second carrier injected from the second electrode to the light emitting layer; and
   a second carrier blocking layer, which is arranged between the light emitting layer and the second electrode, and is configured to block a portion of the second carrier from being transported to the light emitting layer,
   wherein the second carrier blocking layer comprises AlF$_3$.

2. The light-emitting diode of claim 1, wherein the second carrier blocking layer is arranged between the light emitting layer and the second carrier transporting layer.

3. The light-emitting diode of claim 2, wherein the second carrier blocking layer has a refractive index smaller than that of the second carrier transporting layer.

4. The light-emitting diode of claim 1, wherein the second carrier blocking layer is arranged between the second carrier transporting layer and the second electrode.

5. The light-emitting diode of claim 1, wherein the first carrier is hole, and the second carrier is electron.

6. The light-emitting diode of claim 1, wherein the first electrode is a transparent electrode.

7. The light-emitting diode of claim 1, wherein the second electrode is a reflective electrode.

8. The light-emitting diode of claim 1, wherein the second carrier blocking layer has a thickness of 0.5 nm-50 nm.

9. The light-emitting diode of claim 1, wherein the second carrier blocking layer has a thickness which is 1%-20% of a thickness of the second carrier transporting layer.

10. The light-emitting diode of claim 1, wherein the light emitting layer comprises quantum dots.

11. A display device, comprising the light-emitting diode of claim 1.

12. The light-emitting diode of claim 1, wherein the second carrier transporting layer is made from TiO$_2$, or made from TiO$_2$ and ZnO nano-particles.

* * * * *